(12) United States Patent
Noma et al.

(10) Patent No.: US 6,864,172 B2
(45) Date of Patent: Mar. 8, 2005

(54) MANUFACTURING METHOD OF SEMICONDUCTOR DEVICE

(75) Inventors: Takashi Noma, Ota (JP); Hiroyuki Shinogi, Oizumi-machi (JP); Yukihiro Takao, Nitta-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/462,829

(22) Filed: Jun. 17, 2003

(65) Prior Publication Data

US 2004/0063268 A1 Apr. 1, 2004

(30) Foreign Application Priority Data

Jun. 18, 2002 (JP) .......................................... 2002-176775

(51) Int. Cl.[7] ...................... H01L 21/44; H01L 21/8238
(52) U.S. Cl. ...................... 438/674; 438/667; 438/668; 438/672; 438/745
(58) Field of Search ................................ 438/667, 668, 438/672, 674, 745, 202

(56) References Cited

U.S. PATENT DOCUMENTS

| 6,506,681 B2 | * | 1/2003 | Grigg et al. | 438/692 |
| 6,597,059 B1 | * | 7/2003 | McCann et al. | 257/673 |
| 6,649,931 B2 | * | 11/2003 | Honma et al. | 257/48 |

* cited by examiner

Primary Examiner—David Nelms
Assistant Examiner—Renee R. Berry
(74) Attorney, Agent, or Firm—Morrison & Foerster LLP

(57) ABSTRACT

A manufacturing method of a semiconductor device of this invention includes forming metal pads on a Si substrate through a first oxide film, bonding the Si substrate and a holding substrate which bolsters the Si substrate through a bonding film, forming an opening by etching the Si substrate followed by forming a second oxide film on a back surface of the Si substrate and in the opening, forming a wiring connected to the metal pads after etching the second oxide film, forming a conductive terminal on the wiring, dicing from the back surface of the Si substrate to the bonding film and separating the Si substrate and the holding substrate.

23 Claims, 14 Drawing Sheets

MANUFACTURING METHOD OF SEMICONDUCTOR DEVICE

BACKGROUND OF THE INVENTION

1. Field of the Invention

This invention relates to a manufacturing method of a semiconductor device, specifically to a manufacturing method of a BGA (Ball Grid Array) type semiconductor device which has ball-shaped conductive terminals.

2. Description of the Related Art

A BGA type semiconductor device has been known as a kind of surface-mount type semiconductor device. A plurality of ball-shaped conductive terminals made of a metal material such as solder is arrayed in a grid pattern on one principal surface of a package substrate and is connected with a semiconductor die bonded on the other principal surface of the substrate in the BGA type semiconductor device. When the BGA type semiconductor device is mounted into electronic equipment, the semiconductor die and external circuit on a printed circuit board are electrically connected by thermally bonding each of the conductive terminals to each of wiring patterns on the printed circuit board.

Such a BGA type semiconductor device is known to have advantages in providing a large number of connection terminals as well as reducing the size over other surface-mount type semiconductor devices such as an SOP (Small Outline Package) and a QFP (Quad Flat Package), which have lead pins protruding from their sides.

The BGA type semiconductor device was adopted into a CCD image sensor in recent years, and has been used as an image sensor chip mounted in a mobile telephone which is strongly required to reduce the size.

On the other hand, three-dimensional packaging technologies have come to attention, which use a wafer level CSP (Chip Size Package) or a technology to make through-hole interconnection in silicon substrate. These technologies include a method to make through-hole interconnection in silicon substrate after bonding multi layers of chips and a method to stack silicon wafers after making through-hole interconnections in the silicon substrate from the surface.

However, conventional three-dimensional packaging technologies have shortcomings of increased process steps. That is, because processing to make through-hole interconnection in silicon substrate starts from the surface and a via hole is filled with copper, CMP (Chemical Mechanical Polishing) processing from the top surface and re-distribution to connect the copper and a pad after forming the via hole are required. Although copper wiring technology is suitable for fine patterning, increased cost is unavoidable because copper itself is expensive and it is necessary to purchase a specific apparatus additionally.

SUMMARY OF THE INVENTION

The invention provides a manufacturing method of a semiconductor device. The method includes forming a metal pad on the front surface of a semiconductor wafer, attaching a holding substrate to the front surface of the semiconductor wafer by placing a film therebetween, forming an opening by etching the back surface of the semiconductor wafer to expose at least a portion of the metal pad, forming an insulating film on the back surface of the semiconductor wafer and on bottom and side walls of the opening, and etching the insulating film to expose at least a portion of the metal pad. The method also includes forming a wiring pattern connected to the exposed metal pad, forming a protection film on the wiring pattern, forming an electrode on a portion of the wiring pattern that is not covered with the protection film, dicing the semiconductor wafer from the back surface thereof, and separating the semiconductor wafer from the holding substrate.

The invention also provides a manufacturing method of a semiconductor device. The method includes forming a metal pad on the front surface of a semiconductor wafer, attaching a holding substrate to the front surface of the semiconductor wafer by placing a film therebetween, forming an opening by etching the back surface of the semiconductor wafer to expose at least a portion of the metal pad, forming an insulating coating on a side wall of the opening, and filling the opening having the insulating coating with a metal. The method also includes forming an electrode on the opening filled with the metal or on a wiring pattern connected to the opening filled with the metal, dicing the semiconductor wafer from the back surface thereof, and separating the semiconductor wafer from the holding substrate.

DETAILED DESCRIPTION OF THE INVENTION

The first embodiment according to the manufacturing method of the semiconductor device of this invention will be explained referring to the figures hereinafter.

Figure 1:
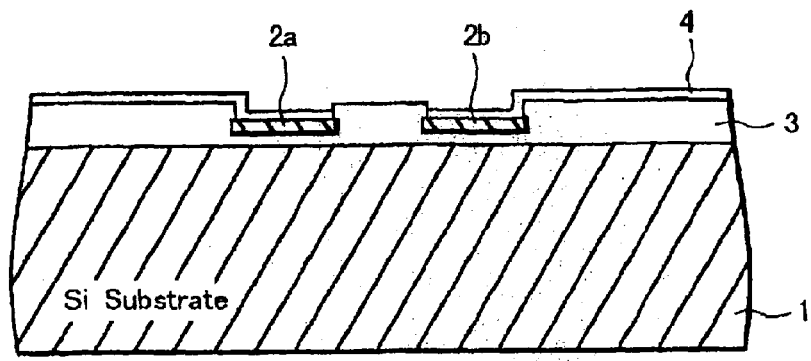
FIG. 1 is a cross-sectional view of a semiconductor device intermediate formed by a step of a manufacturing method of the first embodiment of this invention.

First, an oxide film is formed on a silicon wafer (hereafter referred to as Si substrate) having a thickness of 1 to 600 $\mu$m, a plurality of metal (aluminum, aluminum alloy or copper, for example) pads 2a and 2b are formed on the oxide film, and an $SiO_2$ film or a PSG (phosphosilicate glass) film is formed by plasma CVD to cover the pads 2a and 2b, forming a first oxide film 3 of a predetermined thickness together with the oxide film, as shown in FIG. 1. The pads 2a and 2b are connected with corresponding semiconductor elements formed in the Si substrate 1. The first oxide film 3 may be ground physically or etched chemically, for example, when extra flatness is required. Then portions (surface portions) of the pads 2a and 2b are exposed by etching the first oxide film 3 on the pads 2a and 2b using a photoresist film (not shown) as a mask. After that, a first wiring 4 made of aluminum, aluminum alloy or copper is formed on the surface of the pads 2a and 2b. Total thickness of the first oxide film 3 is about 5 $\mu$m in this embodiment.

Figure 2:
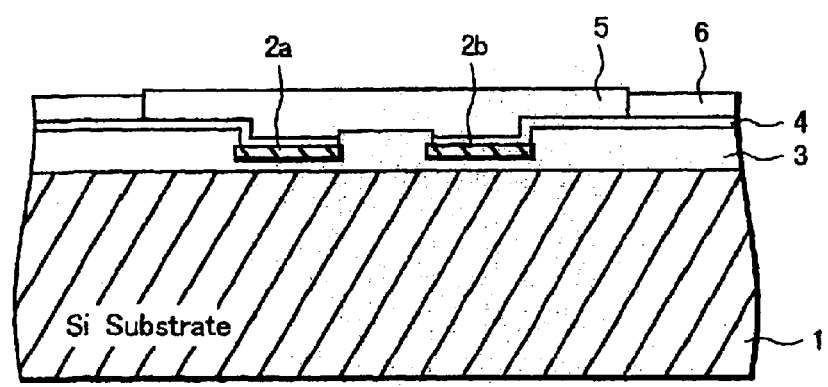
FIG. 2 is a cross-sectional view of a semiconductor device intermediate following the step of FIG. 1.

Next, a polyimide film 5 is formed on the surface of the first wiring 4, and the polyimide film 5 is etched using a photoresist film (not shown) as a mask to form openings on the first wiring 4 connected with the pads 2a and 2b, as shown in FIG. 2. FIG. 2 shows the openings formed at both ends of the polyimide film 5.

Then after nickel (Ni) and gold (Au), which are not shown in the figure, are deposited in the openings, copper (Cu) is plated on them with a conventional plating apparatus to fill the openings with Cu posts 6. Au can be plated on the Cu posts 6 in order to protect the Cu posts 6 from corrosion. The total thickness of the conductive materials (Ni, Au, Cu and Au) filled in the opening is about 25 $\mu$m in this embodiment.

When this process is applied to a CSP process not used for three-dimensional process, there is no need of forming the openings. Thus coating entire surface with polyimide film 5 is enough.

Or a holding substrate 8, which will be described below, may be bonded on the Si substrate 1 without the polyimide film 5 using a bonding film.

When this process is adopted into CCD image sensors, it is necessary to form a transparent polyimide film or a transparent glass epoxy resin using screen printing in place of the polyimide film 5. A glass plate material may be bonded using an epoxy resin.

Figure 3A:
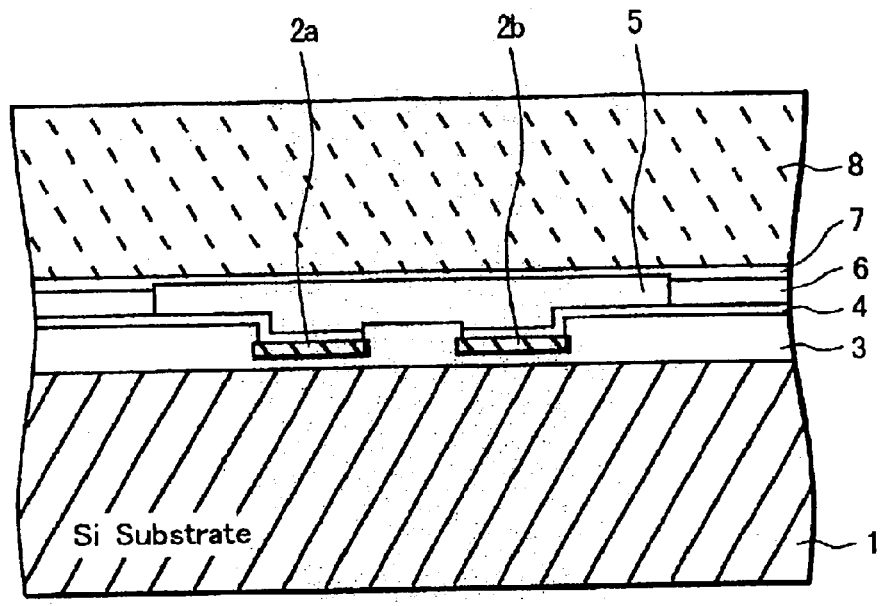
FIG. 3A is a cross-sectional view of a semiconductor device intermediate following the step of FIG. 2.

Next, a bonding film 7 is applied on the polyimide film 5 and the Cu posts 6 (or on Au on the Cu posts 6), and the holding substrate 8 and the Si substrate 1 are bonded together through the bonding film 7, as shown in FIG. 3A.

The holding substrate 8 is a holding material to prevent the Si substrate 1 from cracking during back-grinding of the Si substrate 1, which will be described below. The holding substrate 8 may be a Si plate, an oxide film, a glass substrate, a ceramic layer or the like. Thickness of the holding substrate 8 is about 400 $\mu$m in this embodiment, as required as the holding material.

An organic film soluble in acetone is adopted as the bonding film 7 in order to improve workability in separation process of the Si substrate 1 and the holding substrate 8. Thickness of the bonding film 7 is about 100 $\mu$m in this embodiment. The bonding film 7 is placed on the wafer leaving space at the peripheral portion of the wafer so that an epoxy resin 9 will be placed on the wafer to surround the bonding film 7.

A film without adhesiveness can be used in place of the bonding film, applying adhesive material on both sides of the film to bond the holding substrate 8 and the Si substrate 1 together. In this case, a solvent in which the adhesive material dissolves is used.

Figure 3B:
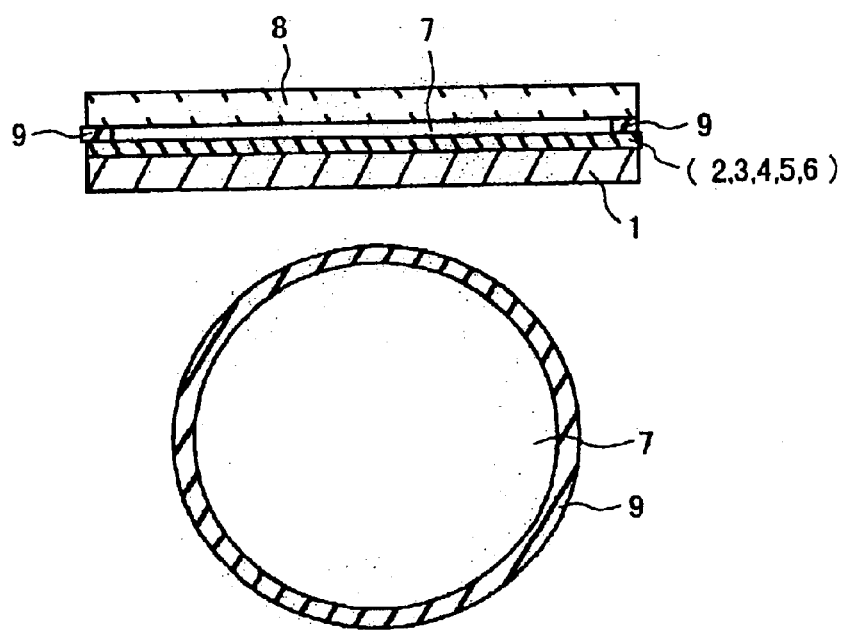
FIG. 3B shows a cross-sectional view and a plan view of an outline of the semiconductor device intermediate of FIG. 3A.

FIG. 3B shows a cross-sectional view and a plan view of an outline of the semiconductor device intermediate shown in FIG. 3A (the holding substrate 8 is omitted for convenience of explanation).

The bonding film 7 is sealed and fixed by packing the periphery of the bonding film 7 with the epoxy resin 9, as shown in FIG. 3B. Infiltration of chemical solution such as an organic solvent during various kinds of processing is prevented by the epoxy resin 9. This epoxy resin 9 may be a polyimide resin.

Figure 4A:
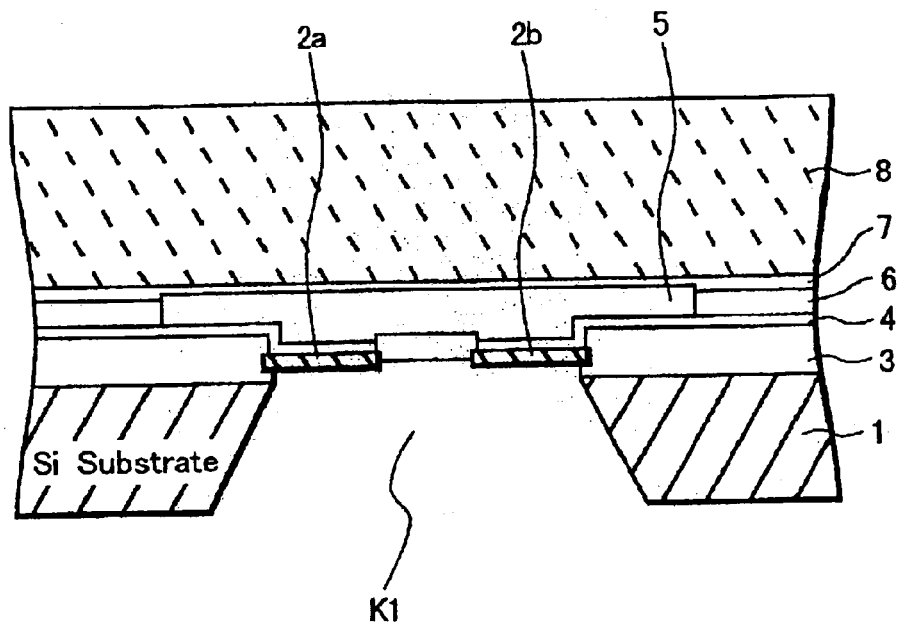
FIG. 4A and FIG. 4B are cross-sectional views of semiconductor device intermediates following the step of FIG. 3A.

Next, the Si substrate 1 is back-ground to make the Si substrate 1 about 10 to 100 $\mu$m thick, as shown in FIG. 4A. The holding substrate 8 bolsters the Si substrate 1 during the back-grinding process. Then the back surface of the Si substrate 1 which is back-ground and the first oxide film 3 are etched to form a first opining K1, so that the pads 2a and 2b are exposed.

Figure 4B:
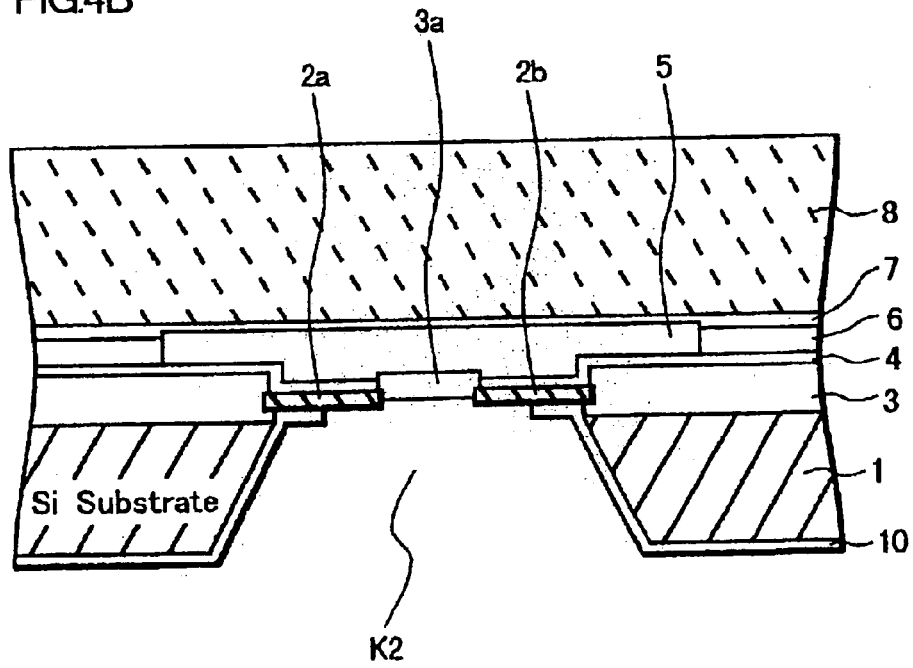

After a second oxide film 10 is deposited on the back surface of the Si substrate 1, the second oxide film 10 is etched to form a second opening K2, using a photoresist film (not shown) as a mask, as shown in FIG. 4B. A portion 3a of the first oxide film 3 is left between the pad 2a and the pad 2b. A silicon nitride film or a polyimide film may be used instead of the second oxide film 10.

Although etching process of the Si substrate 1 is followed by etching process of the first oxide film 3, the second oxide film 10 is formed on the Si substrate 1 and in the first opening K1, and the second oxide film 10 is etched to form the second opening K2 in this embodiment, it is also possible that only the Si substrate 1 is etched, the second oxide film 10 is formed while the first oxide film 3 is left under the pads 2a and 2b, and the second oxide film 10 and the first oxide film 3 are etched to form the second opening K2.

Figure 5:
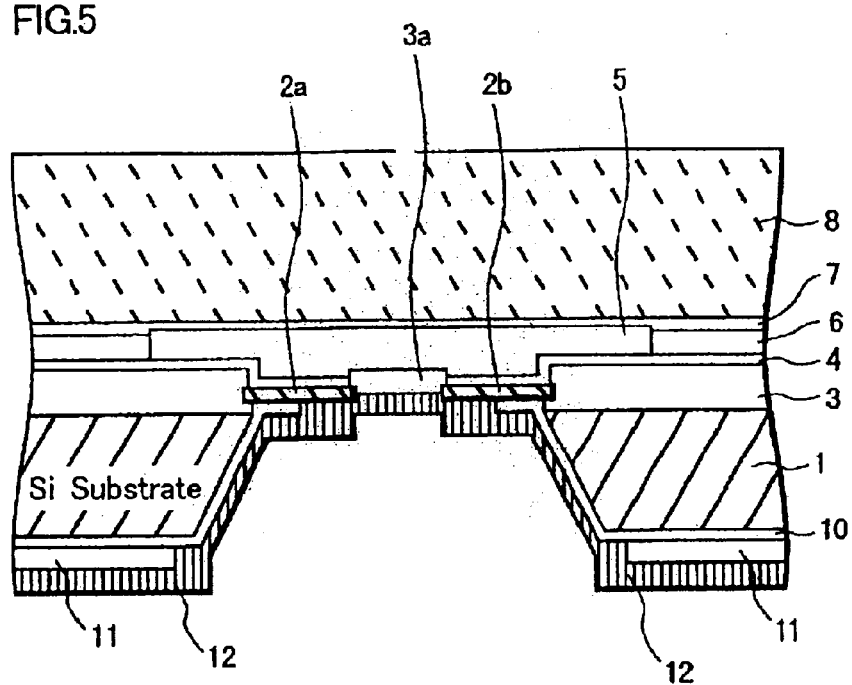
FIG. 5 is a cross-sectional view of a semiconductor device intermediate following the step of FIG. 4B.

Next, cushioning material 11 is formed at desired portions on the surface of the second oxide film 10 and aluminum (Al) or Al alloy is sputtered to cover the cushioning material 11, the second oxide film 10 and the second opening K2, forming the second wiring 12, as shown in FIG. 5. Or the second wiring 12 can be made of copper.

Figure 6:
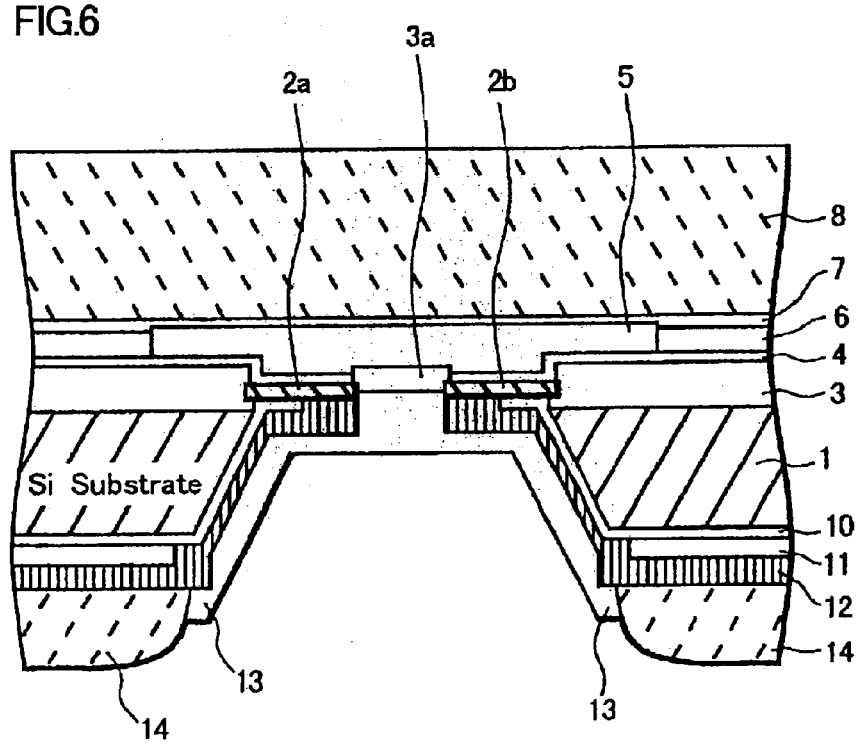
FIG. 6 is a cross-sectional view of a semiconductor device intermediate following the step of FIG. 5.

Next, the second wiring 12 is etched using a photoresist film (not shown) as a mask, so that the first oxide film 3a is exposed, as shown in FIG. 6. That is, the etching is made to align each edge of the pads 2a and 2b with each edge of the second wiring 12 which covers the exposed back surface of the pads 2a and 2b. As a result, each of the pads 2a and 2b and the second wiring 12 are formed to have contacting area of length of about ten to several hundred micrometers. After forming the second wiring 12, electroless nickel (Ni) and gold (Au) plating is applied.

Or, the second wiring 12 may be formed by sputtering titan-tungsten (TiW) instead of aluminum, forming photoresist, electroplating of copper (Cu), removing the photoresist and etching the titan-tungsten (TiW).

Then solder balls (hereafter referred to as conductive terminals) 14 are formed by forming a solder mask (hereafter referred to as a protection film) 13 on the surface of the second wiring 12, screen-printing a solder paste on the protection film 13 and reflow processing of the solder paste. A polyimide film made of Rika-coat (a product of New Japan Chemical Co., Ltd.), which can be imidized at 200° C., is used as the protection film 13 in this embodiment.

Figure 7A:
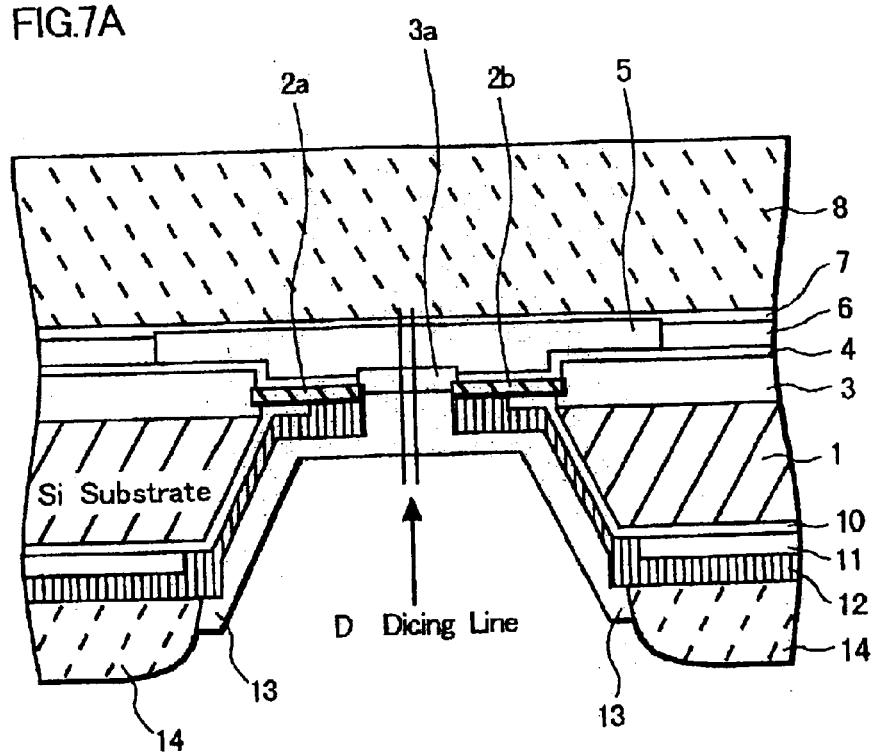
FIG. 7A is a cross-sectional view of a semiconductor device intermediate following the step of FIG. 6.
Figure 7B:
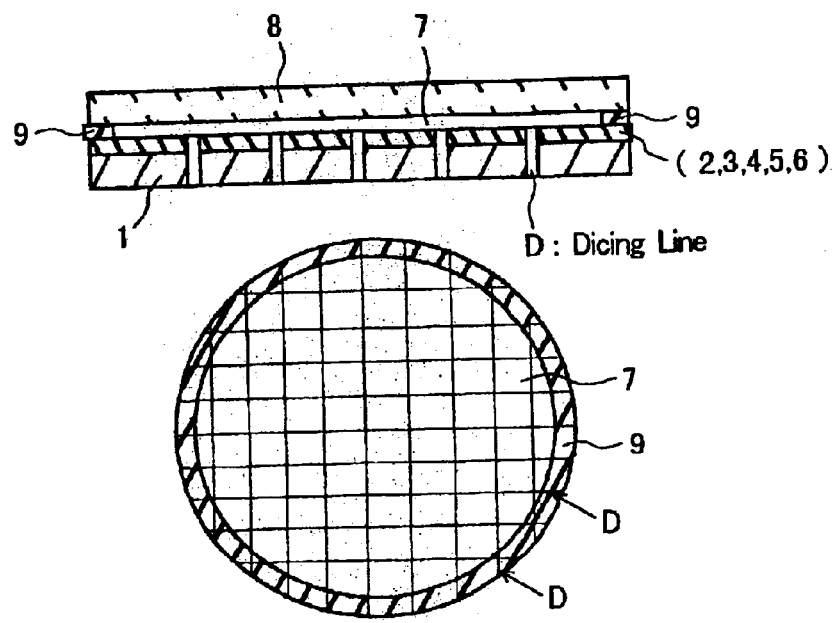
FIG. 7B includes a cross-sectional view and a plan view of an outline of the semiconductor device intermediate of FIG. 7A.

Next, dicing is conducted to form dicing lines D in the first oxide film 3a, as shown in FIG. 7A. The dicing lines D are provided to separate the semiconductor dice on the wafer. FIG. 7B shows a cross-sectional view and a plan view of an outline of the semiconductor device shown in FIG. 7A (the holding substrate 8 is omitted for convenience of explanation). The dicing lines D are formed to reach the bonding film 7 as shown in the cross-sectional view in FIG. 7B. The dicing lines D form a grid pattern as shown in the plan view in FIG. 7B.

Figure 8:
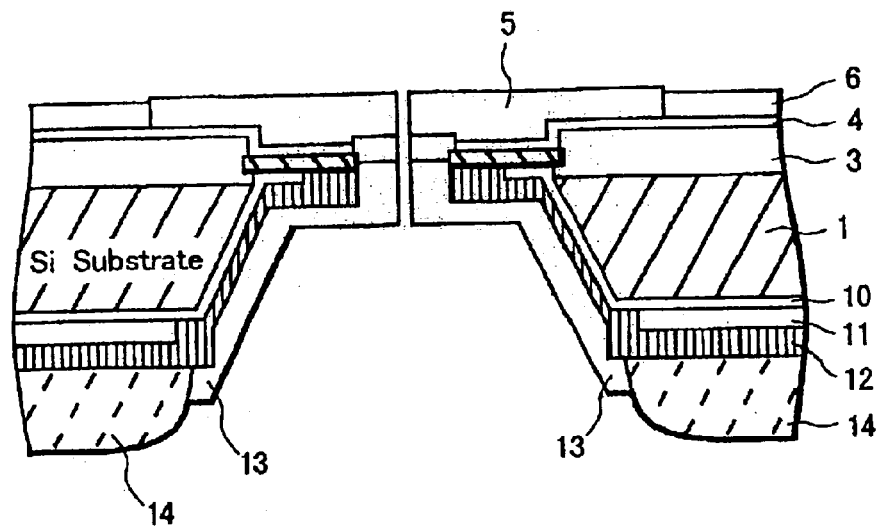
FIG. 8 is a cross-sectional view of a semiconductor device intermediate following the step of FIG. 7A.

Acetone infiltrates through the dicing lines D shown in FIG. 7B to dissolve the bonding film 7, when the Si substrate 1 is immersed in acetone in a solvent tank (not shown). As a result, the Si substrate 1 (each die) and the holding substrate 8 are separated to complete each CSP die as shown in FIG. 8.

The Si substrate 1 and the holding substrate 8 are separated simply by immersing them in acetone after dicing, providing good workability, since the organic bonding film 7 which is soluble in acetone is used to bond the Si substrate 1 and the holding substrate 8 together in this embodiment.

A film having weak adhesion may also be used instead of the bonding film 7, and the dice can be peeled off physically after dicing. Furthermore, when a transparent glass is used as the holding substrate 8, a UV-tape is applied as the organic film 7 and the dice are separated by exposing them to ultraviolet radiation after dicing.

When the Si substrate 1 and the holding substrate 8 are bonded with a non-adhesive film to which UV-type adhesive material is applied in place of the bonding film 7, the Si substrate 1 can be diced after separating the Si substrate 1 and the holding substrate 8 by exposing the UV-type adhesive material to ultraviolet radiation in a later process step and hardening it.

Additionally, the wafer and the holding substrate 8 can be separated by heating the back side of the wafer with a hot plate to melt and soften the organic film (bonding film) 7 sandwiched between the wafer and the holding substrate 8. In this case, if the bonding film 7 is the organic film soluble in acetone, it would melt when heated to about 200° C., and if the bonding film 7 is the polyimide film, it would melt when heated to about 400° C.

As an alternative method to separate the Si substrate 1 and the holding substrate 8, only the periphery of the wafer is dipped in a chemical such as acid (for example sulfuric acid) before the dicing, by rotating the wafer while it is held vertical.

Or, as a method to separate the Si substrate 1 and the holding substrate 8 more directly, there are methods to scrape off the peripheral portion made of the epoxy resin with a cutter, a saw or a knife, or to scrape off that portion by grinding the silicon wafer.

Figure 9:
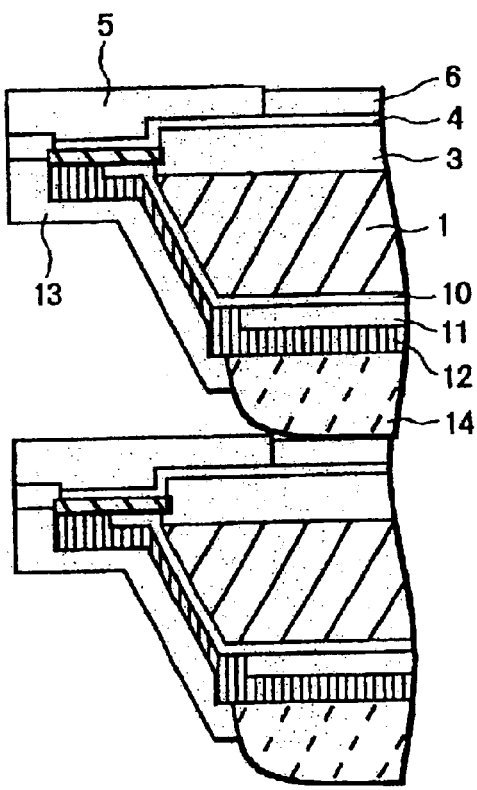
FIG. 9 is a cross-sectional view of a semiconductor device manufactured according to a second embodiment of this invention.

The second embodiment of this invention is shown in FIG. 9. Three-dimensional mounting of any number of layers of CSP chips is possible and capacity can be increased if the dice such as memories are the same in size, by stacking the SCP chips with the Cu post 6 of a CSP chip (a piece of the semiconductor device after separation as shown in FIG. 8) closely contacting to a conductive terminal of another CSP chip.

The third embodiment according to the manufacturing method of the semiconductor device of this invention will be explained referring to figures hereinafter.

Figure 10A:
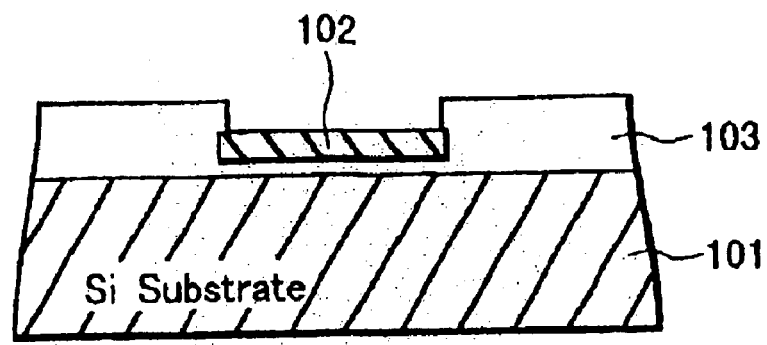
FIG. 10A and FIG. 10B are cross-sectional views of semiconductor device intermediates formed by steps of a manufacturing method of a third embodiment of this invention.

First, an oxide film is formed on a silicon wafer (hereafter referred to as Si substrate) 101 of 600 $\mu$m in thickness, a metal (Al, Al alloy or copper, for example) pad 102 is formed on the oxide film, and an $SiO_2$ film or a PSG film is formed by plasma CVD to cover the pad 102, forming a first oxide film 103 of a predetermined thickness together with the oxide film, as shown in FIG. 10A. The pad 102 is connected with a semiconductor element formed in the Si substrate 101. The first oxide film 103 may be ground physically or etched chemically, for example, when extra flatness is required. Then a portion (surface portion) of the pad 102 is exposed by etching the first oxide film 103 on the pad 102 using a photoresist film (not shown) as a mask. Total thickness of the first oxide film 103 is about 5 $\mu$m in this embodiment.

Figure 10B:
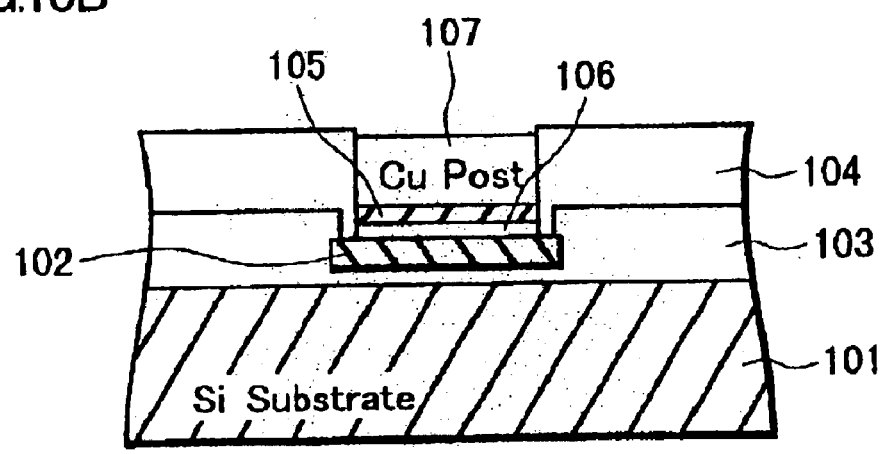

Next, a polyimide film is formed on the pad 102 and the first oxide film 103, and the polyimide film is etched using a photoresist film (not shown) as a mask to form a polyimide film 104 having an opening on the pad 102, as shown in FIG. 10B. Then after nickel (Ni) 105 and gold (Au) 106 are formed in the opening, copper (Cu) is plated on them to fill the opening with a Cu post 107. Au can be plated on the Cu post 107 in order to protect the Cu post 107 from corrosion. Total thickness of the conductive materials (Ni, Au, Cu and Au) filled in the opening is about 25 $\mu$m in this embodiment.

When this process is adopted into the CCD image sensor, it is necessary to form a transparent polyimide film or a transparent glass epoxy resin using screen printing in place of the polyimide film 104. A glass plate material may be bonded using an epoxy resin.

When this process is applied to a CSP process not used for three-dimensional process, there is no need of forming the opening. Thus coating entire surface with polyimide film 104 is enough. As is the case with the first embodiment, a holding substrate 8 may be bonded on the Si substrate 1 without the polyimide film 5 using a bonding film.

Figure 17A:
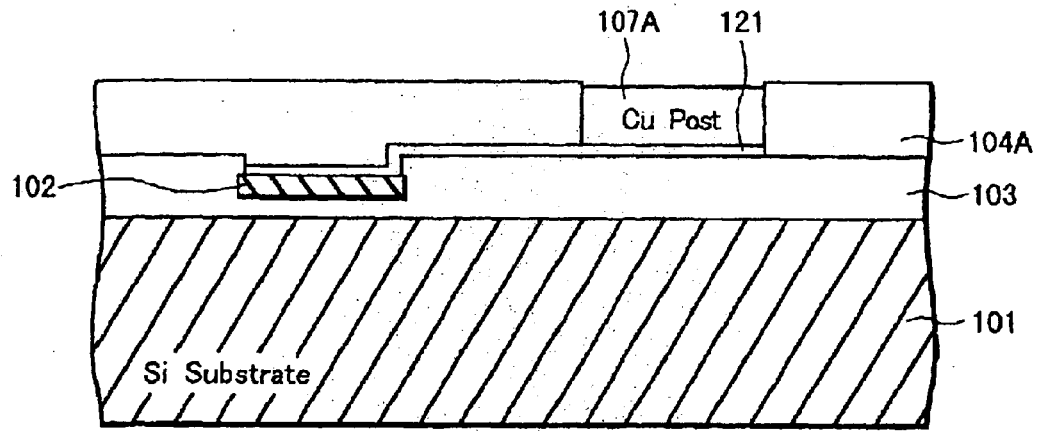
FIG. 17A is a cross-sectional view of a semiconductor device according to a manufacturing method of the fourth embodiment of this invention.

Alternatively, as shown in FIG. 17A, titan-tungsten (TiW) 121 is formed on the pad 102 and the first oxide film 103, and is shaped into a predetermined pattern. Then a polyimide film 104A is formed and a Cu post 107A (and Au) is formed in an opening formed in the polyimide film 104A, adopting so-called re-distribution structure. Au may be plated on the Cu post 107A.

Figure 11A:
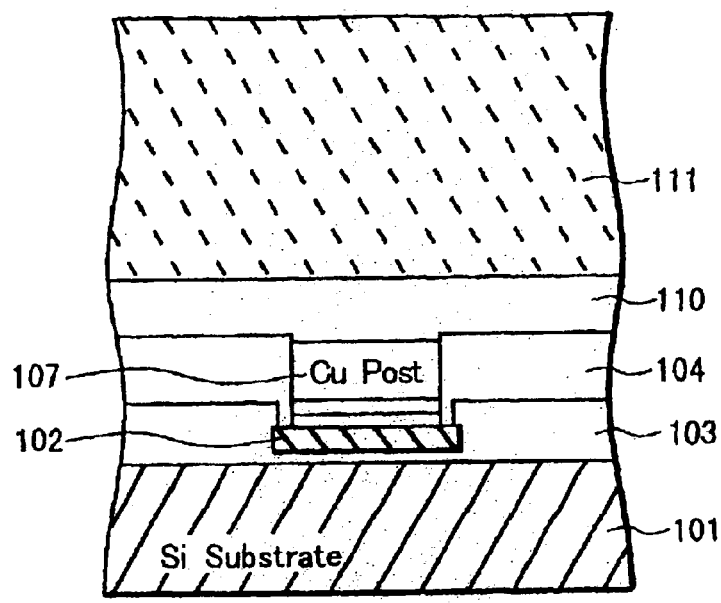
FIG. 11A is a cross-sectional view of a semiconductor device intermediate following the step of FIG. 10A.

Next, a bonding film 110 is applied on the polyimide film 104 and the Cu post 107 (or on Au on the Cu post 107), and a holding substrate 111 and the Si substrate 101 are bonded together through the bonding film 110, as shown in FIG. 11A.

The holding substrate 111 is a holding material to prevent the Si substrate 101 from cracking during back-grinding of the Si substrate 101. Thickness of the holding substrate 8 is about 400 μm in this embodiment, as required as the holding material.

An organic film soluble in acetone is adopted as the bonding film 110 in order to improve workability in separation process of the Si substrate 101 and the holding substrate 111. Thickness of the bonding film 110 is about 100 μm in this embodiment. As is the case with the first embodiment, an epoxy resin 112 surrounds the bonding film 110. The width of the epoxy resin 112 is about 2 mm from outer the edge of the wafer.

A film without adhesiveness can be used in place of the bonding film, applying adhesive material on both sides of the film to bond the holding substrate 111 and the Si substrate 101 together. In this case, a solvent in which the adhesive material dissolves is used.

Figure 11B:
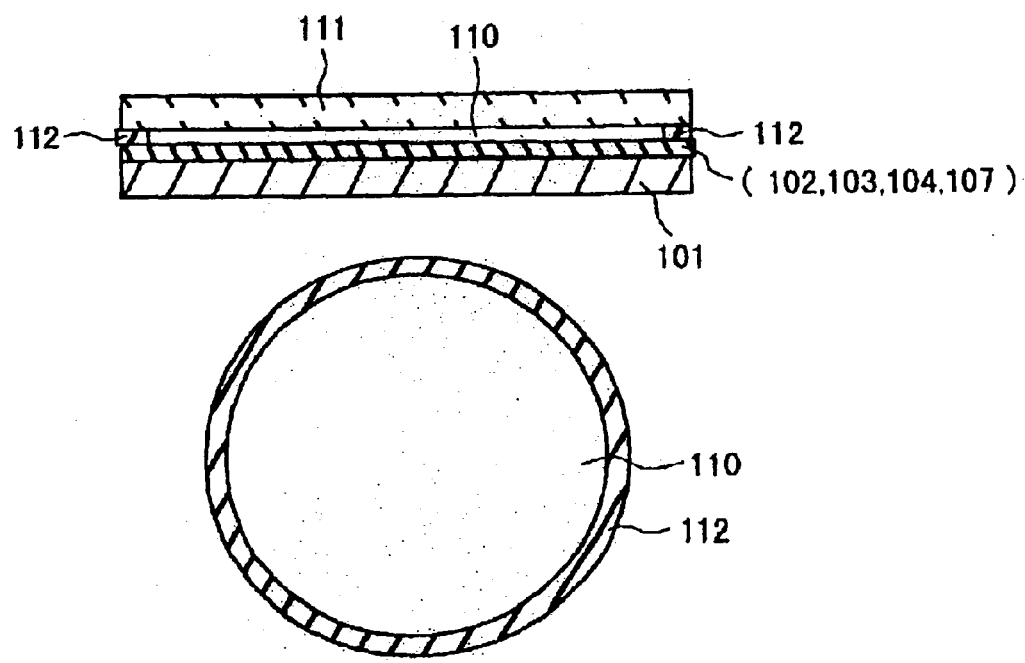
FIG. 11B includes a cross-sectional view and a plan view of an outline of the semiconductor device intermediate of FIG. 11A.

FIG. 11B shows a cross-sectional view and a plan view of an outline of the semiconductor device shown in FIG. 11A (the holding substrate 111 is omitted for convenience of explanation).

The bonding film 110 is sealed and fixed by packing the periphery of the bonding film 110 with the epoxy resin 112, as shown in FIG. 11B. Infiltration of chemical solution such as an organic solvent during various kinds of processing is prevented.

Figure 12A:
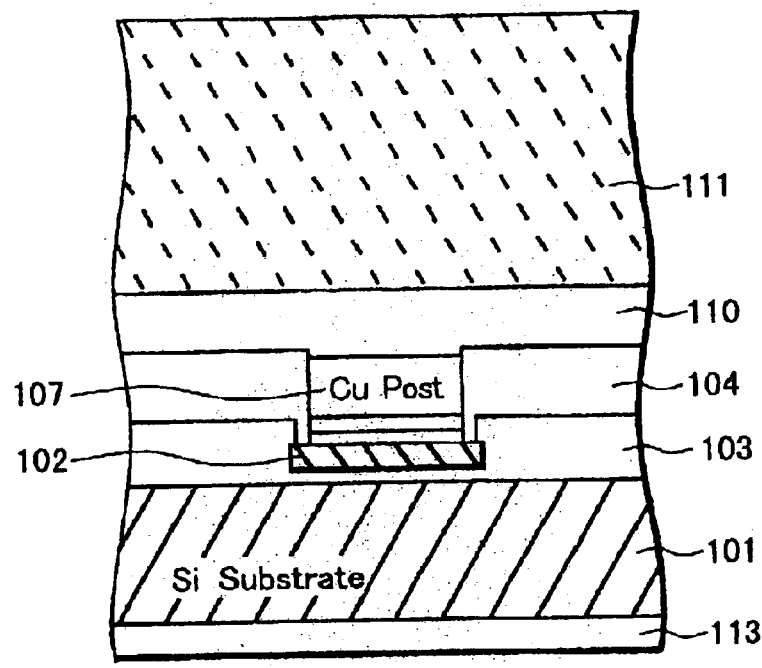
FIG. 12A and FIG. 12B are cross-sectional views of semiconductor device intermediates following the step of FIG. 11A.

Next, the Si substrate 101 is back-ground to make the Si substrate 101 about 10 to 100 μm thick, as shown in FIG. 12A. The holding substrate 111 bolsters the Si substrate 101 during the back-grinding process. Then a second oxide film 113 of 0.01 μm in thickness is formed on a back surface of the Si substrate 101 which is back-ground. A silicon nitride film or an organic insulating material made of polyimide can be used instead of the second oxide film 113. Workability in the back-grind process is good because flatness of surface including the Cu post 107 does not matter and no additional processing is required.

Figure 12B:
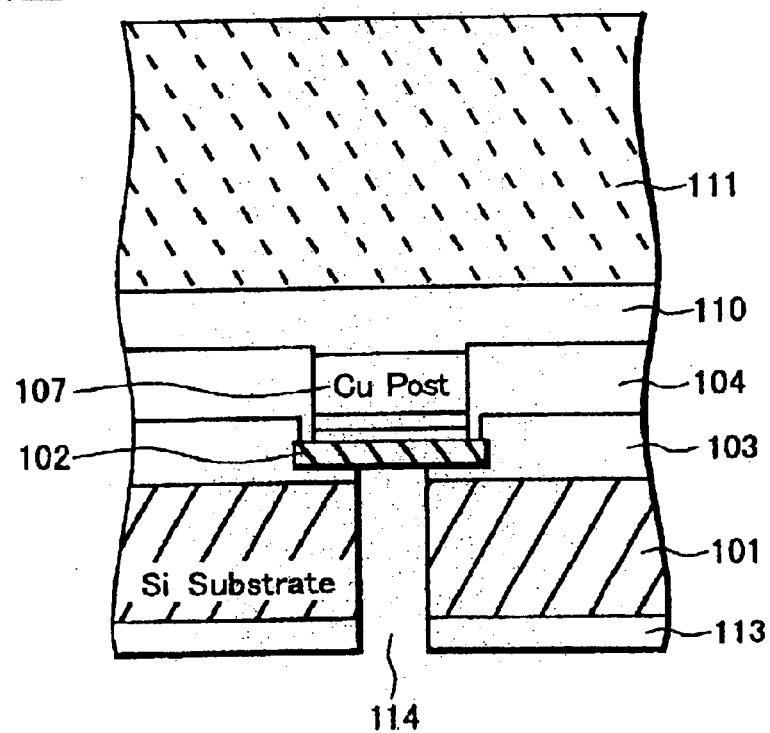
Figure 13A:
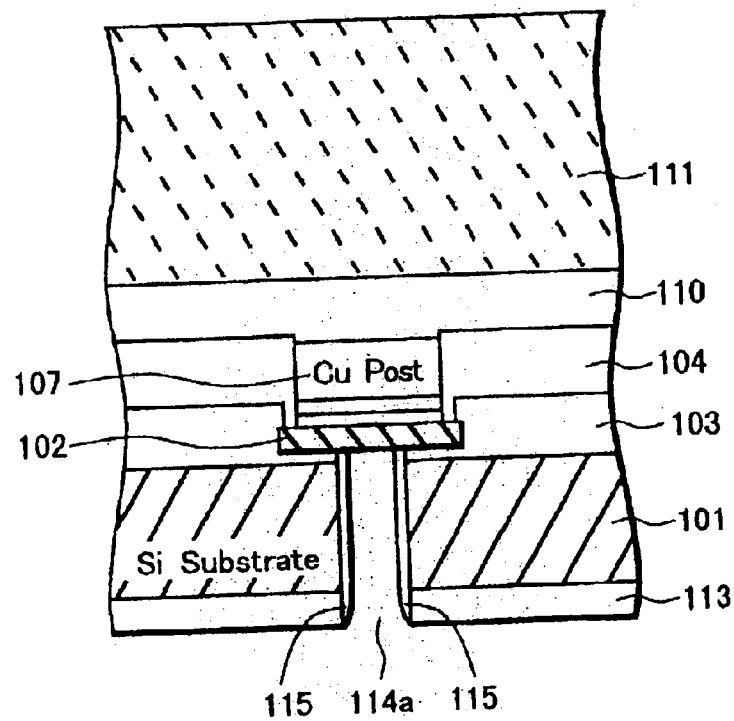
FIG. 13A and FIG. 13B are cross-sectional views of semiconductor device intermediates following the step of FIG. 12B.

An opening 114 is formed by etching the second oxide film 113 and the Si substrate 101 using a photoresist film (not shown) as a mask, as shown in FIG. 12B. After this step, the first oxide film 103 exposed in the opening 114 is etched to expose the pad 102, as shown in FIG. 13A. Then a third oxide film is formed by CVD method to cover the second oxide film 113 and the pad 102 in the opening 114a, and the third oxide film is anisotropically etched to remain on the sidewall of the opening 114a, forming a sidewall spacer film 115. The CVD processing of the third oxide film is made, for example, at low temperature of about 200° C. The sidewall spacer 115 may be made of silicon nitride film.

Figure 13B:
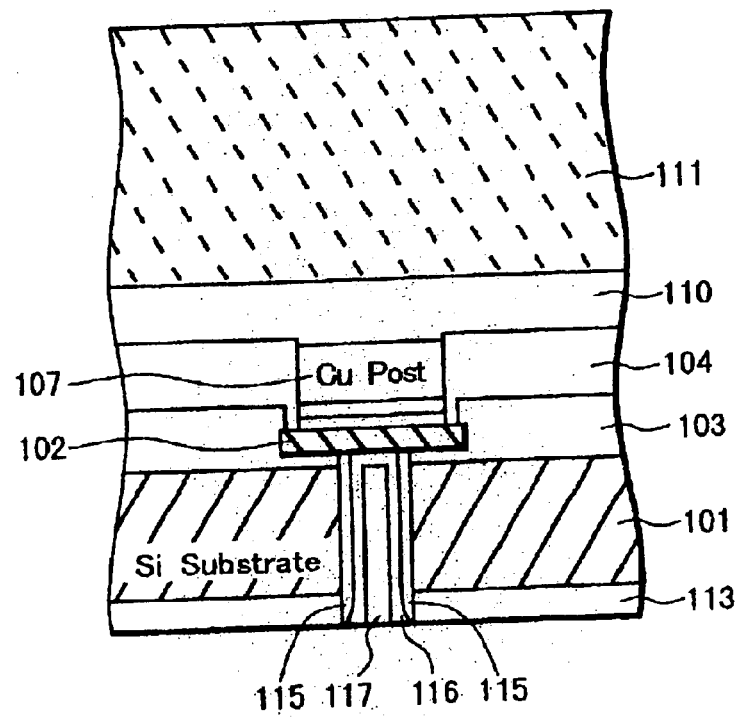

Next, a barrier film 116 made of titanium nitride (TiN) or tantalum nitride (TaN) is sputtered in the opining 114a through the sidewall spacer 115, and copper is filled in the opening 114a through the barrier film 116 to form a Cu buried layer 117, as shown in FIG. 13B. This process step includes Cu seeding, Cu plating and Cu annealing. Then, copper is buried in the opening 114a. When extra flatness is required, the copper is polished by CMP.

Figure 14A:
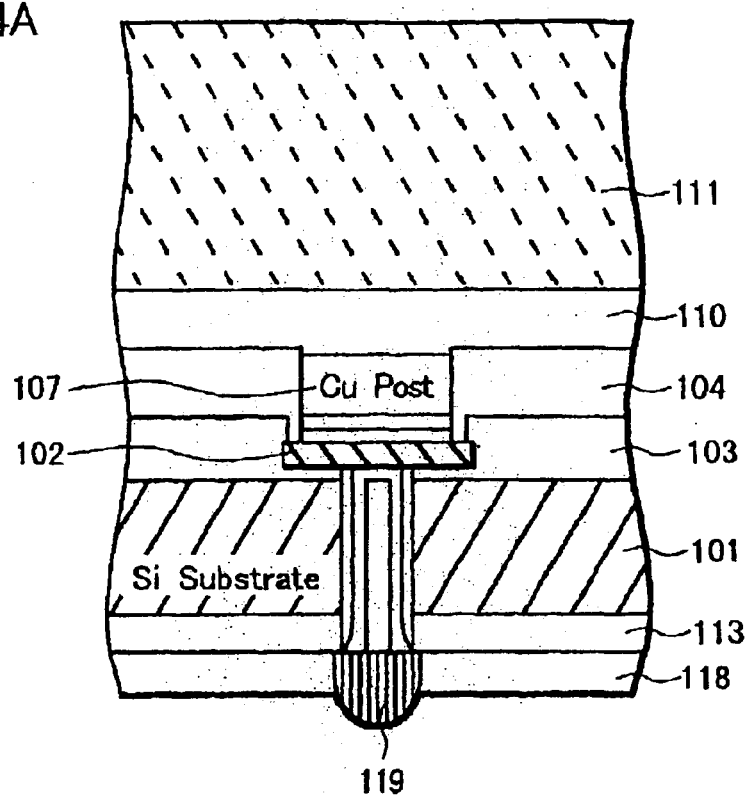
FIG. 14A and FIG. 14B are cross-sectional views of semiconductor device intermediates following the step of FIG. 13B.

Then a solder mask 118 with an opening somewhat wider than the opening 114a filled with Cu is formed on the Cu buried layer 117, and a solder paste is screen-printed in the opening through the solder mask 118 followed by reflow processing of the solder paste to form a solder ball 119 on the Cu buried layer 117, as shown in FIG. 14A. A polyimide film made of Rika-coat (a product of New Japan Chemical Co., Ltd.), which can be imidized at 200° C. is used as the solder mask 118 in this embodiment.

Figure 17B:
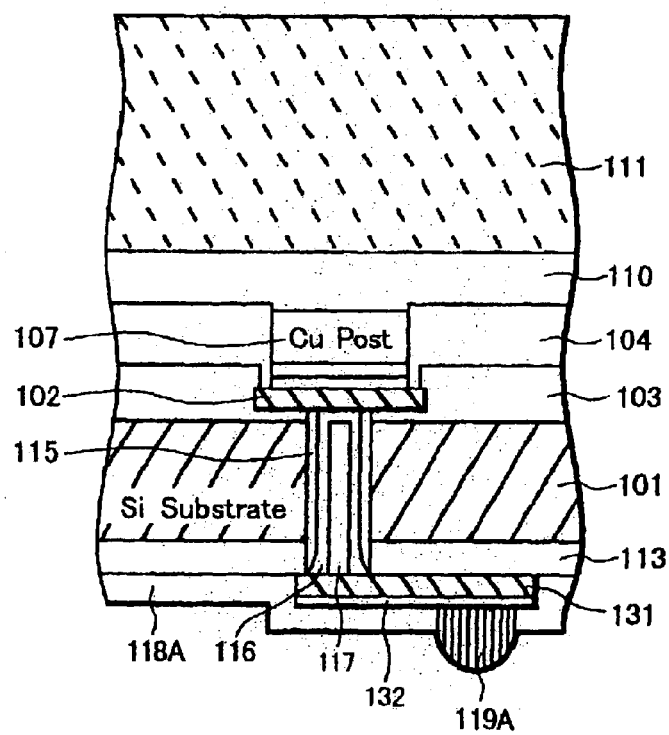
FIG. 17B is a cross-sectional view of a semiconductor device according to a manufacturing method of the fifth embodiment of this invention.

Alternatively, as shown in FIG. 17B, an aluminum film 131 and a nickel film (and a gold film) 132 are formed on the Cu buried layer 117 and the second oxide film 113, and are shaped into a predetermined pattern. A structure in which a solder ball 119A is formed through a solder mask 118A can be adopted.

Figure 14B:
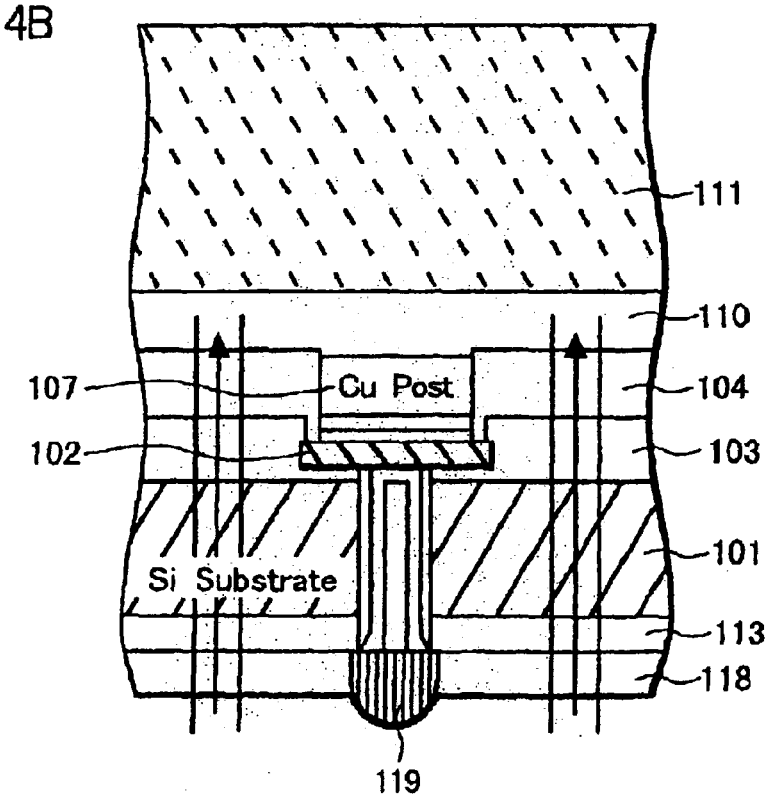

Next, as shown in FIG. 14B, the device is diced from the side of the Si substrate to the depth reaching the bonding film 110.

Figure 15A:
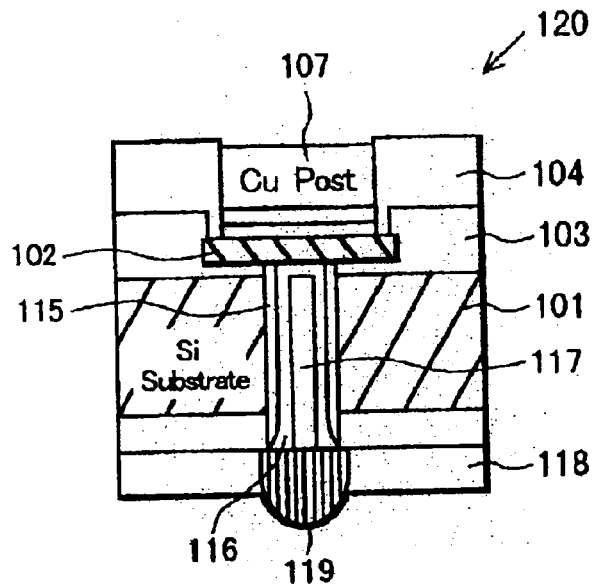
FIG. 15A is a cross-sectional view of a semiconductor device intermediate following the step of FIG. 14B.
Figure 15B:
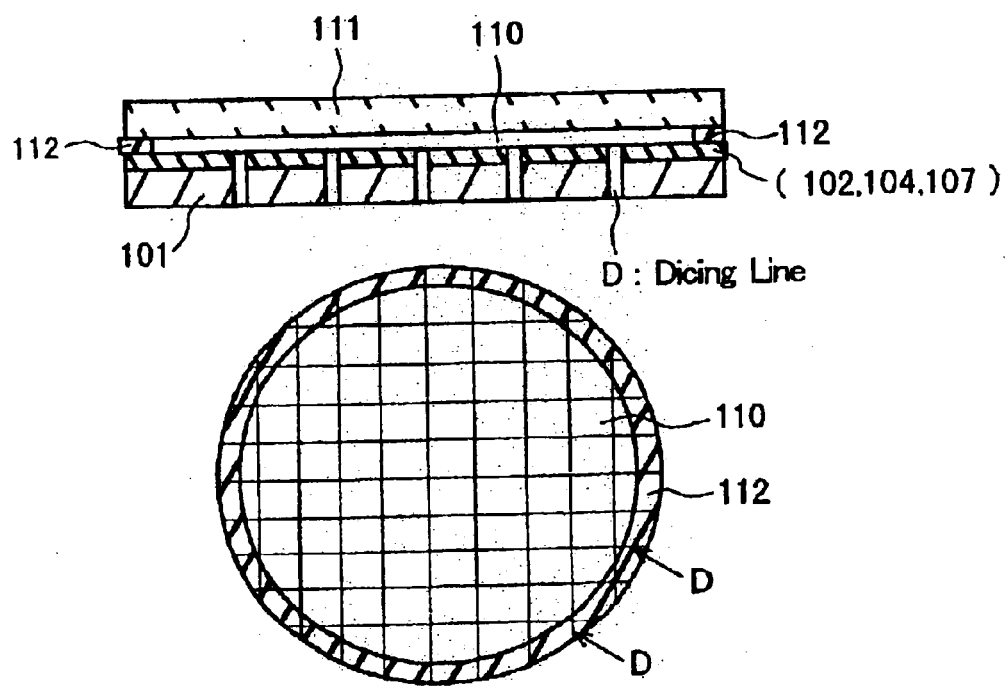
FIG. 15B includes a cross-sectional view and a plan view of an outline of the semiconductor device intermediate of FIG. 15A.
Figure 16:
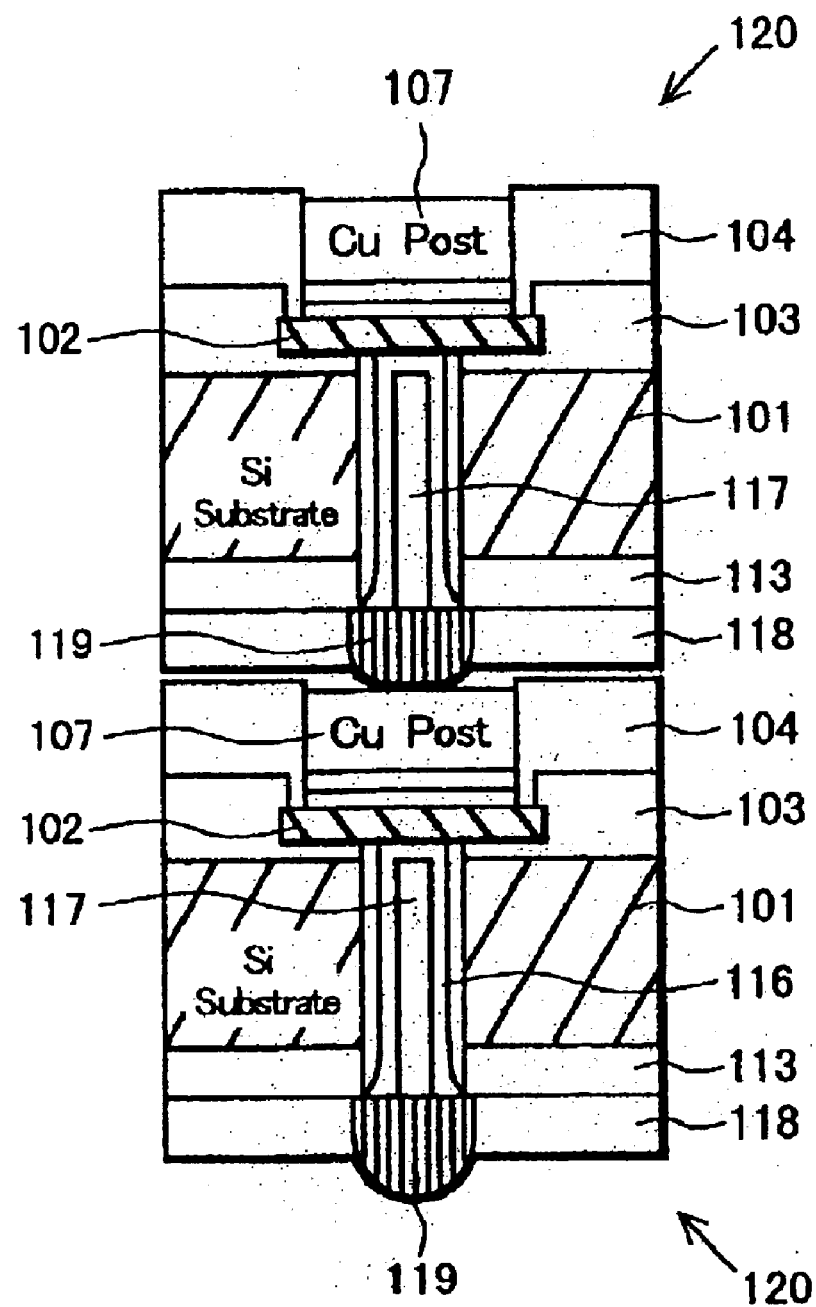
FIG. 16 is a cross-sectional of a semiconductor device intermediate following the step of FIG. 15A.

Acetone infiltrates through dicing lines D shown in FIG. 15B to dissolve the bonding film 110, when the Si substrate 101 is immersed in acetone in a solvent tank (not shown). As a result, the Si substrate 101 (each die) and the holding substrate 111 are separated to complete each CSP die 120 as shown in FIG. 15A.

The Si substrate 101 and the holding substrate 111 are separated simply by immersing them in acetone after dicing, providing good workability, since the organic bonding film 110 which is soluble in acetone is used to bond the Si substrate 101 and the holding substrate 8 together in this embodiment.

Alternatively, a film having weak adhesion may be used instead of the bonding film 110, and the dice can be peeled off physically after dicing. Furthermore, when a transparent glass is used as the holding substrate 111, a UV-tape is applied as the organic bonding film 110 and the dice are separated by exposing them to ultraviolet radiation after dicing.

When the Si substrate 101 and the holding substrate 111 are bonded with a non-adhesive film to which UV-type adhesive material is applied in place of the bonding film 110, the Si substrate 101 may be diced after separating the Si substrate 101 and the holding substrate 111 by exposing the UV-type adhesive material to ultraviolet radiation in a later process step and hardening it.

Additionally, the wafer and the holding substrate 111 may be separated by heating the back side of the wafer with a hot plate to melt and soften the organic film (bonding film) 110 sandwiched between the wafer and the holding substrate 111. In this case, if the bonding film 110 is the organic film soluble in acetone, it would melt when heated to about 200° C., and if the bonding film 110 is the polyimide film, it would melt when heated to about 400° C.

As an alternative method to separate the Si substrate 101 and the holding substrate 111, only the periphery of the wafer is dipped in a chemical such as acid before dicing, by rotating the wafer while it is held vertical. Or, there is a method of scraping off the peripheral portion made of the epoxy resin with a cutter to separate them. After one of these methods is performed, a BG tape is bonded and dicing is conducted.

Three-dimensional mounting of any number of layers is made possible and capacity may be increased if the dice such as memories are the same in size, by stacking the SCP chips 120 with the Cu post 107 (or the Au plated on the Cu post 107) of a CSP chip closely contacting to the solder ball 119 of another CSP chip.

In the embodiments above, wirings are formed with apparatuses such as a sputtering apparatus and a plating apparatus which are used commonly in assembly. Thus, the semiconductor devices are manufactured with a very simple manufacturing process at low cost.

Also, there is no need for CMP from the top surface side, which is required in conventional methods, since making a through-hole in silicon and filling a via hole with copper (Cu) are not made from the surface in this invention, unlike in conventional three-dimensional packaging technologies. Thus, the number of the process steps are reduced.

In the stacked structure, re-distribution wiring to connect a Cu via and a pad after forming the Cu via is not needed, eliminating any additional process step.

Furthermore, thickness of the chip may be reduced as much as possible, since the holding substrate and the Si substrate are subject to back-grinding and the subsequent processing after they are bonded together.

What is claimed is:

1. A manufacturing method of a semiconductor device, comprising:
   forming a metal pad on a front surface of a semiconductor wafer;
   attaching a holding substrate to the front surface of the semiconductor wafer by placing a film therebetween;
   forming an opening by etching a back surface of the semiconductor wafer to expose at least a portion of the metal pad;
   forming an insulating film on the back surface of the semiconductor wafer and on bottom and side walls of the opening;
   etching the insulating film to expose at least a portion of the metal pad;
   forming a wiring pattern connected to the exposed metal pad;
   forming a protection film on the wiring pattern;
   forming an electrode on a portion of the wiring pattern that is not covered with the protection film;
   dicing the semiconductor wafer from the back surface thereof; and
   separating the semiconductor wafer from the holding substrate.

2. The manufacturing method of a semiconductor device of claim 1, wherein the attaching of the holding substrate comprises bonding the semiconductor wafer and the holding substrate on a periphery of the semiconductor wafer using an epoxy resin.

3. The manufacturing method of a semiconductor device of claim 1, wherein the film between the semiconductor wafer and the holding substrate comprises an organic film soluble in an organic solvent.

4. The manufacturing method of a semiconductor device of claim 1, wherein the film between the semiconductor wafer and the holding substrate comprises an adhesive film.

5. The manufacturing method of a semiconductor device of claim 1, wherein the film between the semiconductor wafer and the holding substrate comprises a UV-tape and the holding substrate comprises a transparent glass, wherein ultraviolet radiation is applied to the diced semiconductor wafer.

6. The manufacturing method of a semiconductor device of claim 2, wherein the separating of the semiconductor wafer comprises scraping off the epoxy resin physically using a cutting tool.

7. The manufacturing method of a semiconductor device of claim 2, wherein the separating of the semiconductor wafer comprises dissolving the epoxy resin chemically by immersing the semiconductor wafer in an acid.

8. The manufacturing method of a semiconductor device of claim 2, wherein the separating of the semiconductor wafer comprises grinding a periphery of the semiconductor wafer having the epoxy resin thereon.

9. The manufacturing method of a semiconductor device of claim 1, wherein the forming of the wiring pattern comprises forming an aluminum film and plating films of nickel and gold on the aluminum film.

10. The manufacturing method of a semiconductor device of claim 1, wherein the forming of the wiring pattern comprises forming a titan-tungsten film and plating a copper film on the titan-tungsten film.

11. The manufacturing method of a semiconductor device of claim 1, further comprising grinding the back surface of the semiconductor wafer prior to the forming of the opening.

12. The manufacturing method of a semiconductor device of claim 1, further comprising forming on the front surface of the semiconductor wafer another wiring pattern connected to the metal pad and forming a metal post for electrode connection on said another wiring pattern.

13. The manufacturing method of a semiconductor device of claim 1, wherein the film between the semiconductor wafer and the holding substrate comprises a layer coated with an UV-type adhesive material, and the separating of the semiconductor wafer comprises irradiating the semiconductor wafer with ultraviolet radiation.

14. The manufacturing method of a semiconductor device of claim 1, wherein the dicing of the semiconductor wafer is such that a groove formed by the dicing reaches the film.

15. A manufacturing method of a semiconductor device, comprising:
   forming a metal pad on a front surface of a semiconductor wafer;
   attaching a holding substrate to the front surface of the semiconductor wafer by placing a film therebetween;
   forming an opening by etching a back surface of the semiconductor wafer to expose at least a portion of the metal pad;
   forming an insulating coating on a side wall of the opening;
   filling the opening having the insulating coating with a metal;
   forming an electrode on the opening filled with the metal or on a wiring pattern connected to the opening filled with the metal;
   dicing the semiconductor wafer from the back surface thereof; and
   separating the semiconductor wafer from the holding substrate.

16. The manufacturing method of a semiconductor device of claim 15, wherein the attaching of the holding substrate comprises bonding the semiconductor wafer and the holding substrate on a periphery of the semiconductor wafer using an epoxy resin.

17. The manufacturing method of a semiconductor device of claim 15, wherein the film between the semiconductor wafer and the holding substrate comprises an organic film soluble in an organic solvent.

18. The manufacturing method of a semiconductor device of claim 15, wherein the film between the semiconductor wafer and the holding substrate comprises an adhesive film.

19. The manufacturing method of a semiconductor device of claim 15, wherein the film between the semiconductor wafer and the holding substrate comprises a UV-tape and the holding substrate comprises a transparent glass, wherein ultraviolet radiation is applied to the diced semiconductor wafer.

20. The manufacturing method of a semiconductor device of claim 15, further comprising grinding the back surface of the semiconductor wafer prior to the forming of the opening.

21. The manufacturing method of a semiconductor device of claim 15, further comprising forming on the front surface of the semiconductor wafer a metal post that is disposed on the metal pad or on a wiring pattern formed on the front surface of the semiconductor wafer and connected to the metal pad.

22. The manufacturing method of a semiconductor device of claim 15, wherein the film between the semiconductor wafer and the holding substrate comprises a layer coated with an UV-type adhesive material, and the separating of the semiconductor wafer comprises irradiating the semiconductor wafer with ultraviolet radiation.

23. The manufacturing method of a semiconductor device of claim 15, wherein a diameter of the film between the semiconductor wafer and the holding substrate is smaller than a diameter of the semiconductor wafer or a diameter of the holding substrate.

* * * * *

(12) EX PARTE REEXAMINATION CERTIFICATE (6769th)
United States Patent
Noma et al.

(10) Number: US 6,864,172 C1
(45) Certificate Issued: Apr. 14, 2009

(54) MANUFACTURING METHOD OF SEMICONDUCTOR DEVICE

(75) Inventors: Takashi Noma, Ota (JP); Hiroyuki Shinogi, Oizumi-machi (JP); Yukihiro Takao, Nitta-machi (JP)

(73) Assignee: Sanyo Electric Co., Ltd., Moriguchi-shi, Osaka (JP)

Reexamination Request:
No. 90/008,219, Oct. 16, 2006

Reexamination Certificate for:
Patent No.: 6,864,172
Issued: Mar. 8, 2005
Appl. No.: 10/462,829
Filed: Jun. 17, 2003

(30) Foreign Application Priority Data

Jun. 18, 2002 (JP) .................... 2002-176775

(51) Int. Cl.
H01L 21/60 (2006.01)
H01L 23/28 (2006.01)
H01L 21/02 (2006.01)
H01L 21/70 (2006.01)
H01L 23/31 (2006.01)
H01L 23/485 (2006.01)
H01L 25/065 (2006.01)
H01L 23/48 (2006.01)
H01L 21/68 (2006.01)
H01L 21/67 (2006.01)
H01L 21/768 (2006.01)

(52) U.S. Cl. .................. 438/674; 438/667; 438/668; 438/672; 438/745; 257/E25.013; 257/E23.011; 257/E23.021; 257/E23.02; 257/E21.597; 257/E21.508

(58) Field of Classification Search .................. None
See application file for complete search history.

(56) References Cited

U.S. PATENT DOCUMENTS

| | | |
|---|---|---|
| 5,229,647 A | 7/1993 | Gnadinger |
| 5,350,662 A | 9/1994 | Chi |
| 5,691,245 A | 11/1997 | Bakhit |
| 6,027,958 A | 2/2000 | Vu et al. |
| 6,042,922 A | 3/2000 | Senoo et al. |
| 6,110,825 A | 8/2000 | Mastromatteo et al. |
| 6,136,668 A | 10/2000 | Tamaki et al. |
| 6,506,681 B2 | 1/2003 | Grigg et al. |
| 6,597,059 B1 | 7/2003 | McCann et al. |
| 6,649,931 B2 | 11/2003 | Honma et al. |
| 6,864,172 B2 | 3/2005 | Noma et al. |
| 2001/0005043 A1 | 6/2001 | Nakanishi |
| 2004/0229405 A1 | 11/2004 | Prabhu |
| 2005/0176235 A1 | 8/2005 | Noma et al. |
| 2007/0166957 A1 | 7/2007 | Kambyama |

FOREIGN PATENT DOCUMENTS

| | | |
|---|---|---|
| EP | 1-041-617 A1 | 10/2000 |
| JP | 6-2101678 A | 5/1987 |
| JP | 3-152942 A | 6/1991 |
| JP | 05-287082 | 11/1993 |
| JP | 10-242084 A | 9/1998 |
| JP | 11-307624 A | 11/1999 |
| JP | 2000-183025 | 6/2000 |
| JP | 2001-068618 A | 3/2001 |
| JP | 2001-185519 | 7/2001 |
| JP | 2001-210667 A | 8/2001 |
| JP | 2002-083785 | 3/2002 |
| JP | 2002-512436 A | 4/2002 |
| JP | 2002-270676 | 9/2002 |
| JP | 2005-191550 | 7/2005 |
| WO | WO99/36958 A1 | 7/1999 |
| WO | WO99/40624 A1 | 8/1999 |

*Primary Examiner*—Erik Kielin

(57) ABSTRACT

A manufacturing method of a semiconductor device of this invention includes forming metal pads on a Si substrate through a first oxide film, bonding the Si substrate and a holding substrate which bolsters the Si substrate through a bonding film, forming an opening by etching the Si substrate followed by forming a second oxide film on a back surface of the Si substrate and in the opening, forming a wiring connected to the metal pads after etching the second oxide film, forming a conductive terminal on the wiring, dicing from the back surface of the Si substrate to the bonding film and separating the Si substrate and the holding substrate.

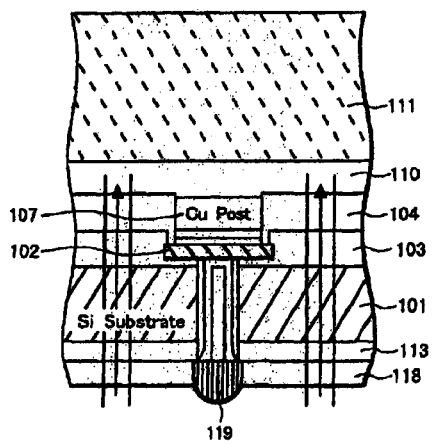

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1 and 15 are cancelled.
Claims 2–14 and 16–23 were not reexamined.

* * * * *